United States Patent
McGrath et al.

(10) Patent No.: US 6,331,201 B1
(45) Date of Patent: Dec. 18, 2001

(54) BISMUTH COATING PROTECTION FOR COPPER

(75) Inventors: Peter T. McGrath, Mission Viejo; Abayomi I. Owei, Rancho Cucamonga, both of CA (US)

(73) Assignee: Fry's Metals, Inc., Providence, RI (US)

( * ) Notice: Subject to any disclaimer, the term of this patent is extended or adjusted under 35 U.S.C. 154(b) by 0 days.

(21) Appl. No.: 09/403,900

(22) PCT Filed: Mar. 31, 1998

(86) PCT No.: PCT/US98/06479

§ 371 Date: Jan. 18, 2000

§ 102(e) Date: Jan. 18, 2000

(87) PCT Pub. No.: WO98/49367

PCT Pub. Date: Nov. 5, 1998

Related U.S. Application Data
(60) Provisional application No. 60/045,010, filed on Apr. 28, 1997.

(51) Int. Cl.[7] ............................. C23C 18/54; C23C 18/31
(52) U.S. Cl. ............................................. 106/1.22; 106/1.25
(58) Field of Search .................................. 106/1.22, 1.25; 427/436

(56) References Cited

U.S. PATENT DOCUMENTS

| | | | |
|---|---|---|---|
| 3,268,353 | 8/1966 | Melillo | 117/47 |
| 3,303,029 | 2/1967 | Senda et al. | 106/1.22 |
| 3,615,892 | 10/1971 | Heinzelman Jr. | 148/6.15 |
| 3,615,897 | 10/1971 | Banush | 148/6.24 |
| 4,014,660 | 3/1977 | Schreiner et al. | 29/183.5 |
| 4,441,118 | 4/1984 | Fister et al. | 357/70 |
| 4,935,312 | 6/1990 | Nakayama et al. | 428/642 |
| 5,435,838 | * 7/1995 | Melton et al. | 106/1.22 |
| 5,554,211 | * 9/1996 | Bokisa et al. | 106/1.22 |
| 5,554,700 | 9/1996 | Schipfer et al. | 525/360 |

FOREIGN PATENT DOCUMENTS

| | | |
|---|---|---|
| 549500 | 3/1977 | (RU) . |
| 637457 | 12/1978 | (RU) . |
| 779432 | 11/1980 | (RU) . |
| 1631634 | 2/1991 | (RU) . |
| 1798379 | 2/1993 | (RU) . |

OTHER PUBLICATIONS

Cavalloti et al, "Tin and Bismuth Substitutes For Electrodeposited Lead," Proc. AESF Annu. Tech. Conf. (1994), 81st, pp. 499–508 (English Abstract Only).

Kalugin et al, "Deposition of a Tin–Bismuth Alloy From Solutions With Sulfur–Containing Ligands By a Displacement Reaction," Gal'vanotekh, Obrab. Poverkhn. (1992), 1(3–4), pp. 55–56 (with English Abstract).

Kudryavtsev et al, "Electrodeposition of Tin–Based Alloy As Functional Coatings," Plating and Surface Finishing, Jul. 1992, pp. 56–61.

Latatuyev, "The Deposition of Dense Bismuth Coatings on Copper Surfaces" *Mechanical Engineering News*, Jul. 1993, pp. 37–38 (English Translation).

* cited by examiner

Primary Examiner—Helene Klemanski
(74) Attorney, Agent, or Firm—Miles & Stockbridge P.C.

(57) ABSTRACT

Copper-containing surfaces, such as a copper surface for use in an electrical circuit, are protected by the provision of a bismuth metal coating immersion-plated from a moderately to strongly acidic plating bath. The plating bath preferably contains dissolved bismuth, halide, and a sulfur-containing ligand as a complexing agent that promotes adhesion of the bismuth coating. The bath may be formed from a concentrate system combined with water. The concentrate system may be a two-component system having an acidic first component containing the bismuth, halide, and sulfur-containing ligand, and an alkaline second component containing an additional complexing agent (e.g., EDTA salt). Tarnish resistance of the plated bismuth can be improved by the application of an alkaline composition to neutralize residual acid. Plating thickness can be enhanced by pre-cleaning the surface to be plated with a pre-cleaner containing nitric acid.

34 Claims, No Drawings

BISMUTH COATING PROTECTION FOR COPPER

CROSS-REFERENCE TO RELATED APPLICATION

This application claims the benefit of U.S. Provisional Application No. 60/045,010 filed Apr. 28, 1997.

BACKGROUND OF THE INVENTION

This invention relates to bismuth coating protection for copper-containing surfaces and is more particularly concerned with improved compositions and methods for providing protective bismuth metal platings on such surfaces.

The present invention constitutes a further development from the invention described in commonly assigned International Patent Application No. PCT/US95/03574, published under publication No. WO 95/25008 and incorporated herein by reference.

Briefly stated, the prior application describes compositions, and methods of use, for immersion plating bismuth metal onto copper-containing surfaces, such as copper surfaces of printed circuit boards (copper pads for receiving surface-mount electronic components, copper-plated through holes for receiving the leads of pin-in-hole type electronic components, etc.). Immersion plating is a well known process in which a dissolved metal is displaced out of solution by a more active (less noble) base metal from a workpiece surface that is contacted with a plating medium containing the dissolved metal. Displacement occurs due to a difference between the electropotentials of the plating metal and the base metal, with the displaced metal depositing on and coating the workpiece surface. The workpiece may be contacted with the plating medium by any suitable contacting method, such as dipping, spraying, or flood coating.

Immersion-plated bismuth metal coatings provide excellent protection of copper-containing surfaces against tarnishing, corrosion, and other agents that can impair surface quality. As a protectant for copper surfaces of printed circuit boards, for example, immersion-plated bismuth metal coatings have been found to constitute an effective means of preserving solderability prior to and during processing of the boards for circuit assembly. They also exhibit a high surface energy which promotes wetting during soldering, and a high degree of flatness which is desirable for mounting surface-mount electronic components. As contrasted with lead-tin protective coatings commonly used in the electronics industry, protective bismuth metal coatings are not subject to degradation by the formation of intermetallics with copper. Nor do they exhibit the problems of oxidation, volitization on heating, and poor solderability (especially poor hole-fill for wave soldering) that typify less widely used organic protective coatings.

The coating compositions of the prior application are acidic aqueous systems containing dissolved bismuth and halide, such as chloride or bromide. The bismuth is preferably provided as a constituent of a bismuth salt, and the halide as a constituent of the acid (i.e., a halogen acid). The acid solubilizes the bismuth salt, and the halide shifts the relative electropotentials of the bismuth and copper to enable the plating reaction to proceed.

In a preferred mode, the invention of the prior application also utilizes an iodide, such as an iodide salt or an organic iodide, as a complexing agent to promote adhesion of the bismuth metal coating to the surface being plated. The iodide may be provided as an ingredient of the plating bath, or as part of a pre-plating bath with which the surface is treated prior to immersion plating.

SUMMARY OF THE INVENTION

In accordance with the present invention, it has been discovered that effective adhesion of immersion-plated bismuth metal to copper-containing surfaces (including copper surfaces) can be achieved through the use of a sulfur-containing ligand—for example, a thiourea derivative or a thione compound—as a completing agent to promote bismuth adhesion. It has also been discovered that, relative to iodide as an adhesion-promoting agent, significant advantages may be obtained with a sulfur-containing ligand. These advantages include one or more of improved tarnish resistance of the bismuth metal plating (both during and after rinsing and drying), greater coating thickness of the plating, and lower operating temperature of the plating bath.

Thus, in one of its principal aspects, the present invention provides a coating composition that is effective for immersion plating a coating of bismuth metal onto a copper-containing surface, and that comprises a moderately to strongly acidic mixture containing dissolved bismuth, halide, and a sulfur-containing ligand as a complexing agent.

In another of its principal aspects, the present invention provides a moderately to strongly acidic coating composition that is effective for immersion plating a coating of bismuth metal onto a copper-containing surface, and that comprises a salt of bismuth solubilized in a halogen acid, and a sulfur-containing ligand as a complexing agent.

According to still further aspects of the invention, methods of protecting a copper-containing surface are provided, in which the surface is contacted with a composition according to either of the aspects described above, to form a bismuth metal coating on the surface.

Yet another aspect of the invention relates to a method that is broadly applicable to immersion bismuth plating processes to enhance the thickness of the bismuth coating. As will be explained hereinafter, it has been discovered that by pre-cleaning of the surface to be plated with a nitric acid based pre-cleaner, it is possible to significantly increase the immersion bismuth coating thickness relative to processes that do not involve such a pre-cleaning agent.

Still another aspect of the present invention relates to a generally applicable method that improves the tarnish resistance of a bismuth metal coating deposited from an acidic plating bath. As will be explained hereinafter, it has been found that by contacting the plated bismuth coating with an alkaline composition that neutralizes acid residues on the coating, the susceptibility of the coating to tarnishing is greatly reduced.

The aforementioned and other aspects of the present invention will be more fully appreciated from the following detailed description.

DETAILED DESCRIPTION OF THE INVENTION

Immersion bismuth plating compositions in accordance with the present invention are moderately to strongly acidic systems containing, as principal ingredients, dissolved bismuth, halide, sulfur-containing ligand, and water (preferably deionized). The bismuth is conveniently provided in the form of a bismuth salt, such as bismuth trioxide, bismuth chloride, etc. The bismuth salt is dissolved by the acid to form bismuth ions that can be deposited on a copper-containing surface. The preferred concentration of bismuth salt is from about 0.5 to about 20 grams per liter of the plating composition. The halide may be provided as a constituent of the acid, hydrochloric acid being preferred. Another suitable halogen acid is hydrobromic acid. The halide is present in an amount effective to cause the bismuth to plate substantially uniformly over the entire surface to be coated, and is preferably present in an amount substantially in excess of the stoichiometric amount of bismuth. The use of a non-halogen acid, such as sulfuric acid, would require a suitable supplemental source of halide, as will be appreciated by those skilled in the art.

As previously stated, the plating compositions of the invention are moderately to strongly acidic. The pH is most preferably less than 1, but the invention may be practiced with compositions of higher pH, although the plating rate will probably be reduced. The pH should ordinarily be less than about 3. A pH exceeding 4 is not preferred because, at such levels, satisfactory bismuth plating rates and coating thicknesses may not be achieved. The preferred low pH formulations in accordance with the invention are characteristically stable and therefore do not require the addition of stabilizers, such as ammonium ion and the like.

The sulfur-containing ligand is preferably constituted by a thiourea derivative, a thione compound, or a combination thereof. Thiourea per se is not preferred due to toxicity concerns. The sulfur-containing ligand is present in the plating composition in an amount effective to promote the adhesion of plated bismuth metal to the copper-containing surface to be coated. The preferred concentration range is from about 0.001 to about 5 grams per liter, with concentrations less than 1 gram per liter being especially preferred. Concentrations outside the preferred range tend to provide a lower degree of bismuth adhesion and otherwise to reduce the quality of the bismuth metal plating, as, for example, in relation to its appearance and to the distribution of the bismuth on the plated surface.

Exemplary sulfur-containing ligands among thiourea derivatives and thione compounds include, respectively, allyl thiourea and 1-methyl-3-propylimidazole-2-thione, with the former being more preferred. Bismuth metal coatings deposited from immersion plating compositions formulated with either or both of these ingredients have been found to be more resistant to tarnishing (by oxidation) than coatings plated from comparable compositions formulated with iodide. This advantage was readily noticeable upon completion of rinsing and drying of freshly plated coatings, since bismuth coatings deposited from the immersion plating compositions that rely on iodide as the adhesion-promoting agent tended to exhibit a slight degree of tarnishing at the completion of the rinsing and drying phase.

Allyl thiourea has also been found to enhance the bismuth coating thickness as compared with iodide. Depending on the bath temperature and contact time with the workpiece surface, coating thicknesses achieved with plating compositions containing allyl thiourea may be three to four (or more) times those achieved with compositions that rely on iodide to promote bismuth adhesion. In addition, allyl thiourea has been found to promote bismuth adhesion quite effectively at lower bath operating temperatures than iodide, which is advantageous from a safety standpoint. Lower operating temperatures may also allow for the use of less expensive processing equipment. In test plating copper surfaces of printed circuit board panels, for example, compositions using allyl thiourea were found to produce excellent platings at operating temperatures from about 134° F., whereas compositions that relied on iodide required operating temperatures of at least around 150° F. and still did not provide a coating of equal quality.

Various optional ingredients may be included in the immersion bismuth compositions of the invention. For example, additional complexing agents may be included for purposes such as adjustment of the deposition rate and/or modification of the metallic characteristics of the deposited bismuth metal coating. Any complexing agent for bismuth ions or copper ions that is compatible with the remaining ingredients of the plating composition may be used. The total concentration of such additional complexing agents will vary depending upon the particular agent or agents used and the desired effects in any given application. When additional complexing agents are employed, an aggregate concentration of up to about 300 grams per liter of the plating composition is preferred.

In accordance with a preferred implementation of the invention, a combination of additional completing agents, including glycolic acid and dimethyl amine hydrochloride, with or without an EDTA (ethylene diamine tetraacetic acid) salt, has been found to provide excellent results. Exemplary concentration ranges for the combination are: glycolic acid (70%) @ 30–150 grams per liter, dimethyl amine hydrocholoride @ 0.05–20 grams per liter, and EDTA salt @ 0.5–20 grams per liter of the plating composition.

Another optional ingredient of the plating composition is a tarnish inhibitor. The use of tarnish inhibitors in immersion plating compositions is disclosed in International Patent Application No. PCT/GB95/02877, which is assigned to an affiliate of the assignee of the present application and incorporated herein by reference. In the present invention, the tarnish inhibitor is preferably a film-forming agent, such as a polyoxyethylated fatty amine, which forms a protective molecular film at the surface of the plated bismuth metal coating. The preferred concentration of film-forming agent is from about 0.01 to about 2 grams per liter of the plating composition.

The inclusion of a minor amount of a nitrate ion source, such as nitric acid, has been found to be beneficial in enhancing the uniformity of the bismuth metal deposit, although the precise mechanism by which this occurs is not understood. The preferred nitrate ion source concentration is from about 0.05 to about 5 grams per liter of the plating composition.

Still another optional ingredient that may be beneficial is a pre-addition of copper. The use of a copper pre-addition to enhance bismuth deposit thickness and resistance to humidity aging is described in earlier mentioned International Application No. PCT/US95/03574. Copper may be added as any type of soluble salt, such as copper chloride, copper sulfate, copper acetate, etc. It is contemplated that for most applications, the amount of pre-added copper (as copper) will not exceed about 1 gram per liter of the plating composition.

Surfactants may be included in the plating composition to lower the surface tension and to promote uniform wetting of surfaces. Surfactants are also useful to control foaming properties. The preferred surfactant concentration is from about 0.01 to about 5 grams per liter of the plating composition.

Other optional ingredients that may advantageously be employed in the compositions of the invention include, but are not limited to, brighteners, grain refiners, and pH buffers. Exemplary concentration ranges for these ingredients are: brightener @ 0.05–20 grams per liter, grain refiner @ 0.01–15 grams per liter, and pH buffer @ 2.5–100 grams per liter of the plating composition.

The following summarizes the basic parameters of preferred immersion bismuth compositions in accordance with the present invention, concentrations being given in grams per liter:

| bismuth salt | 0.5–20 |
|---|---|
| halogen acid (concentrated) | 50–800 |
| sulfur-containing ligand | 0.001–5 |
| additional complexing agent(s) | 0–300 |
| film-forming agent | 0–2 |
| nitrate ion source | 0–5 |
| copper pre-addition | 0–1 |
| surfactant, brightener, etc. | 0–200 |
| deionized water | remainder |
| pH | <1 (most preferred). |

As will be appreciated by those skilled in the art, the immersion bismuth compositions of this invention can be prepared quite easily. For example, compositions of the invention can readily be prepared by solubilizing the bismuth salt in the acid, and adding the remaining ingredients to the resulting solution in any suitable order, with thorough mixing.

For convenience of transportation and storage, the ingredients may be provided in concentrate form, which can simply be diluted with water to make the final plating composition. Like the plating compositions, concentrates can be prepared quite simply, by mixing the ingredients in any suitable order. Depending on the particular plating composition, a system using more than one concentrate may be advantageous. For example, when the plating composition includes a constituent (e.g., EDTA or a derivative thereof) having low solubility in an acidic concentrate, a two-part concentrate system including an acidic first concentrate and an alkaline second concentrate may be used.

The following formulations are illustrative of a two-part concentrate system. The second concentrate is provided to accommodate the use of EDTA salt, which has poor solubility in the acidic concentrate, as a complexing agent in the final plating composition. The pH buffer of the second concentrate, which may be sodium hydroxide, for example, is effective to maintain the EDTA salt in solution, both in the concentrate and in the final plating composition. The two concentrates may be combined in equal proportions, for example, and diluted with water to for the final plating composition (e.g., 20% by volume of each concentrate with 60% by volume of water). The first concentrate may also be used alone to prepare plating compositions of this invention, by diluting it with water.

Acidic first concentrate composition (grams per liter):

| bismuth salt | 2.5–100 |
|---|---|
| halogen acid (concentrated) | 250–4,000 |
| sulfur-containing ligand | .005–25 |
| additional complexing agent(s) | 0–1,500 |
| film-forming agent | 0–10 |
| nitrate ion source | 0–25 |
| Surfactant, brightener, etc. | 1–1,000 |
| copper pre-addition | 0–5 |
| Water (deionized) | remainder |

Alkaline second concentrate composition (grams per liter):

| EDTA salt | 2.5–100 |
|---|---|
| pH buffer | 12.5–500 |
| water (deionized) | remainder |

The processing of copper-containing surfaces in practice of the invention will ordinarily involve three phases: surface preparation, immersion bismuth plating, and final processing. Surface preparation may include standard pre-plating procedures, such as cleaning and microetching, to ensure optimum bismuth adhesion.

Immersion bismuth plating is conducted by contacting the copper-containing surface with the immersion plating composition. Conventional contacting methods may be used, including dipping, spraying, and flood coating, for example. The plating reaction is self-limiting, but the plating rate and the characteristics of the bismuth metal deposit (e.g., thickness, adhesion strength, uniformity, and appearance) can be adjusted to a substantial degree by controlling the contact duration and the operating temperature of the plating composition. Optimum contact duration and operating temperature for a given application may be determined empirically, and will vary depending upon the particular plating composition used, the desired plating rate, and the desired characteristics of the deposited bismuth metal coating. For typical applications, such as the plating of copper surfaces of printed circuit boards, it is believed that satisfactory results will ordinarily be obtained with a contact duration from about 30 seconds to about 5 minutes and an operating temperature from about 120° to about 200° F. For safety reasons and simplicity of equipment requirements, it is preferable to use an operating temperature that is as low as possible while consistent with the achievement of desired results.

Final processing of the immersion-plated surface may include conventional procedures, such as water rinsing and air drying. In a preferred mode of the invention, the final processing also includes an alkaline rinse.

It has been discovered in connection with the present invention that the use of an alkaline rinse subsequent to bismuth deposition from an acidic plating composition is effective to significantly enhance the tarnish resistance of the plated bismuth metal coating—in particular, by neutralizing residual acid present on the coating. Any alkaline rinse that is compatible with the materials of the coated workpiece and effective- to neutralize the residual acid may be used. It is to be understood that the foregoing aspect of the present invention is not limited to use with immersion bismuth platings per se, but is more generally applicable to bismuth metal coatings deposited from acidic plating compositions.

EXAMPLES

Examples C1, C2, P1, P2, U1, U2, W2, Z1, Z2:

Immersion bismuth plating compositions were prepared from concentrate in accordance with the formulations appearing in the corresponding tables hereinafter (concentrations in grams per liter). Concentrate A (acidic) in each example was prepared by mixing the ingredients in the order listed in the tables, using a two liter beaker. More particularly, the appropriate proportion of water (deionized) was added to the container, followed by additions of the bismuth trioxide, hydrochloric acid, and glycolic acid. These ingredients were thoroughly mixed to dissolve the bismuth trioxide completely. The remaining ingredients were then added and thoroughly mixed. Concentrate B (alkaline) in each example was provided to accommodate the use of EDTA salt (Versene 100) as previously described, and was prepared by pouring approximately 70% by volume of the water (deionized) into a beaker, followed by additions of the sodium hydroxide, the Versene 100, and the balance of the water. The two concentrates were combined 20% by volume each with 60% by volume of water (deionized) to form the immersion bismuth plating composition. In all cases, the plating composition had a pH less than 1.

| EXAMPLE C1 | Concentrate A | Concentrate B | Immersion Bismuth |
|---|---|---|---|
| DI Water | 13.33 | 707.17 | 744.1 |
| Bismuth Trioxide | 24.24 | — | 4.65 |
| Hydrochloric Acid, 37% | 569.64 | — | 113.93 |
| Glycolic Acid, 70% | 603.58 | — | 120.72 |
| Allyl Thiourea | .61 | — | .12 |
| Carbowax 1450 NF* | .61 | — | .12 |
| Sodium Hydroxide, 50% | — | 435.93 | 87.19 |
| Versene 100** | — | 67.81 | 13.56 |

*Grain Refiner, polyethylene glycol, Union Carbide.
**Complexing agent, contains tetrasodium salt of EDTA 37 wt %; disodium ethylenediaminediacetate 1 wt %, trisodium ethylenediaminetriacetate 1 wt %, trisodium nitrilotriacetate 1 wt %, sodium hydroxide 1 wt %, sodium glycolate 3 wt %, water 56 wt %; Van Waters & Rogers Inc.

| EXAMPLE C2 | Concentrate A | Concentrate B | Immersion Bismuth |
|---|---|---|---|
| DI Water | 13.37 | 707.17 | 744.1 |
| Bismuth Trioxide | 24.31 | — | 4.86 |
| Hydrochloric Acid, 37% | 571.33 | — | 114.27 |
| Glycolic Acid, 70% | 581.67 | — | 116.33 |
| Allyl Thiourea | 24.31 | — | 4.86 |
| Carbowax 1450 NF | .61 | — | .12 |
| Sodium Hydroxide, 50% | — | 435.93 | 87.19 |
| Versene 100 | — | 67.81 | 13.56 |

| EXAMPLE P1 | Concentrate A | Concentrate B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 569.64 | 113.93 | 113.93 |
| Glycolic Acid, 70% | 599.94 | 120.72 | 119.99 |
| Dimethylamine HCl | .61 | — | .12 |
| Potassium Chloride* | 2.42 | — | .49 |
| Allyl Thiourea | 1.21 | — | .24 |
| Carbowax 1450 NF | .61 | — | .12 |
| Sodium Hydroxide, 50% | — | 435.93 | 67.19 |
| Versene 100 | — | 67.81 | 13.56 |

*Used to test effect of potassium ion; bismuth platings had whitish haze

| EXAMPLE P2 | Concentrate A | Concentrate B | Immersion Bismuth |
|---|---|---|---|
| DI Water | 13.33 | 707.17 | 744.9 |
| Bismuth Trioxide | 24.19 | — | 4.84 |
| Hydrochloric Acid, 37% | 557.14 | 113.93 | 111.43 |
| Glycolic Acid, 70% | 565.97 | 120.72 | 113.19 |
| Dimethylamine HCl | 24.19 | — | 4.84 |

-continued

| EXAMPLE P2 | Concentrate A | Concentrate B | Immersion Bismuth |
|---|---|---|---|
| Potassium Chloride | 12.10 | — | 2.42 |
| Allyl Thiourea | 12.10 | — | 2.42 |
| Carbowax 1450 NF | .61 | — | .12 |
| Sodium Hydroxide, 50% | — | 435.93 | 87.19 |
| Versene 100 | — | 67.81 | 13.56 |

| EXAMPLE U1 | Concentrate A | Concentrate B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 569.64 | — | 113.93 |
| Glycolic Acid, 70% | 602.24 | — | 120.45 |
| Dimethylamine HCl | .61 | — | .12 |
| Tartaric Acid* | .61 | — | .12 |
| SXS 40** | .12 | — | .02 |
| Allyl Thiourea | .61 | — | .12 |
| Carbowax 1450 NF | .61 | — | .12 |
| Sodium Hydroxide, 50% | — | 435.93 | 87.19 |
| Versene 100 | — | 67.81 | 13.56 |

*Brightener
**Sodium xylene sulfonate 40%, surfactant, Lacco Inc.

| EXAMPLE U2 | Concentrate A | Concentrate B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 569.64 | — | 113.93 |
| Glycolic Acid, 70% | 541.16 | — | 108.23 |
| Dimethylamine HCl | 24.24 | — | 4.85 |
| Tartaric Acid | 12.12 | — | 2.42 |
| SXS 40 | 2.42 | — | .05 |
| Allyl Thiourea | 24.24 | — | 4.85 |
| Carbowax 1450 NF | .61 | — | .12 |
| Sodium Hydroxide, 50% | — | 435.93 | 87.19 |
| Versene 100 | — | 67.81 | 13.56 |

| EXAMPLE W2 | Concentrate A | Concentrate B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 569.24 | — | 113.93 |
| Glycolic Acid, 70% | 538.74 | — | 107.75 |
| Dimethylamine HCl | 24.24 | — | 4.65 |
| Tartaric Acid | 14.54 | — | 2.91 |
| SXS 40 | 2.42 | — | .49 |
| Allyl Thiourea | 24.24 | — | 4.65 |
| Carbowax 1450 NF | .61 | — | .12 |
| Sodium Hydroxide, 50% | — | 435.93 | 87.19 |
| Versene 100 | — | 67.81 | 13.56 |

| EXAMPLE Z1 | Concentrate A | Concentrate B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 569.24 | — | 113.93 |
| Glycolic Acid, 70% | 599.58 | — | 119.92 |
| Dimethylamine HCl | .61 | — | .12 |
| Tartaric Acid | .61 | — | .12 |
| SXS 40 | .12 | — | .02 |
| Allyl Thiourea | .61 | — | .12 |
| Nitric Acid | .61 | — | .12 |
| Carbowax 1450 NF | .61 | — | .12 |
| Chemeen C-2* | .12 | — | .02 |
| Sodium Hydroxide, 50% | — | 435.93 | 87.19 |
| Versene 100 | — | 67.81 | 13.56 |

*Film forming agent, polyoxyethylated fatty amine (Bis [2-Hydroxyethyl] Coco Amine), Chemax Inc.

| EXAMPLE Z2 | Concentrate A | Concentrate B | Immersion Bismuth |
|---|---|---|---|
| DI Water | 13.33 | 707.17 | 744.1 |
| Bismuth Trioxide | 24.31 | — | 4.86 |
| Hydrochloric Acid, 37% | 571.33 | — | 114.27 |
| Glycolic Acid, 70% | 512.38 | — | 102.47 |
| Dimethylamine HCl | 24.31 | — | 4.86 |
| Tartaric Acid | 12.16 | — | 2.43 |
| SXS 40 | 2.43 | — | .49 |
| Allyl Thiourea | 24.31 | — | 4.86 |
| Nitric Acid | 24.31 | — | 4.86 |
| Carbowax 1450 NF | .61 | — | .12 |
| Chemeen C-2 | 6.1* | — | 1.22 |
| Sodium Hydroxide, 50% | — | 435.93 | 87.19 |
| Versene 100 | — | 67.81 | 13.56 |

Comparative Examples M1, M2:

For purposes of comparison, immersion bismuth plating compositions containing iodide as the adhesion-promoting agent were prepared from concentrate in accordance with the formulations shown in the following tables (concentrations in grams per liter). The concentrates and the plating compositions were prepared in the same manner as in the examples described above. The pH of each plating composition was less than 1.

| COMPARATIVE EXAMPLE M1 | Concentrate A | Concentrate B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 569.64 | — | 113.93 |
| Glycolic Acid, 70% | 603.58 | — | 120.72 |
| Potassium Iodide | .61 | — | .12 |
| Carbowax 1450 NF | .61 | — | .12 |
| Sodium Hydroxide, 50% | — | 435.93 | 87.19 |
| Versene 100 | — | 67.81 | 13.56 |

| COMPARATIVE EXAMPLE M2 | Concentrate A | Concentrate B | Immersion Bismuth |
|---|---|---|---|
| DI Water | 13.37 | 707.17 | 744.10 |
| Bismuth Trioxide | 24.31 | — | 4.86 |
| Hydrochloric Acid, 37% | 571.33 | — | 114.27 |
| Glycolic Acid, 70% | 581.67 | — | 116.33 |
| Potassium Iodide | 24.312 | — | 4.86 |
| Carbowax 1450 NF | .61 | — | .12 |
| Sodium Hydroxide, 50% | — | 435.93 | 87.19 |
| Versene 100 | — | 67.81 | 13.56 |

2 in.×6 in. test panels, FR4-based, drilled (0.18 mil hole diameter) and copper electroplated, were immersion plated using the compositions of the examples and comparative examples described above. The panels were processed according to the following sequence of operations:

1. Acid pre-clean, 3 minutes @ 110° F. with PC 7051 pre-cleaner (sulfuric acid/hydroxyacetic acid based pre-cleaner available from Alpha Metals, Inc) 20% by volume in water.
2. Free flowing tap water rinse, 1 minute.
3. Microetch, 2 minutes at 85° F. with PC 7077 (sodium persulfate/sulfuric acid based etchant available from Alpha Metals, Inc.) 50% by volume in water.
4. Free flowing tap water rinse, 1 minute.
5. Immersion bismuth plate, 2 minutes @ 135° F. (160° F. for comparative examples M1, M2).
6. Free flowing tap water rinse, 1 minute.
7. Deionized water rinse, 1 minute.
8. Dry.

An additional set of panels was processed as above, except that the following steps were added between steps 6 and 7:

6a. Alkaline rinse (by immersion), 30 seconds @ room temperature with PC 7019 (phosphate based alkaline cleaner available from Alpha Metals, Inc.) 5% by volume in water.
6b. Free flowing tap water rinse, 1 minute.

After completion of the plating process, the test panels were visually inspected and found to exhibit satisfactory appearance and uniformity of the deposited bismuth metal coatings. Coatings from Examples Z1 and Z2 in particular had an excellent, bright gray appearance. Coatings from Examples P1 and P2 notably had a whitish haze. Comparative Examples M1 and M2 tended to produce darker gray coatings, which may be less desirable.

Test panels were also subjected to bismuth adhesion and relative humidity testing. Bismuth adhesion was tested using conventional transparent, pressure-sensitive adhesive tape. In particular, a strip of tape was applied to the bismuth metal coating with slight finger pressure, allowed to set for one minute, and then removed. If no underlying copper was exposed by removal of the tape, the panel was regarded as passing.

All of the aforementioned examples of the invention passed the adhesion test. Comparative Example M2 also passed the adhesion test, while Comparative Example M1 failed. In addition, for the passing examples, the tape strips were visually examined for the amount of bismuth removed. The panels that were processed with a post-plating alkaline rinse (PC 7019) tended to exhibit less bismuth removal than panels plated from the same composition but not subjected to the alkaline rinse.

Relative humidity testing was conducted by suspending plated test panels above a salt water solution (sodium chloride and water) in a covered glass vessel at 65° C. for 48 hours. With the exception of panels plated from the compositions of Examples Z1 and Z2, all panels processed without a post-plating alkaline rinse failed the test (exhibited significant oxidation), although panels plated from the other compositions of the invention tended to exhibit less oxidation than those plated from the comparative examples. The compositions of Examples Z1 and Z2 included a film-forming agent, Chemeen C-2, and passed the relative humidity test. This demonstrated the advantage of including a film-forming agent as a tarnish inhibitor in the immersion bismuth composition.

All test panels processed with a post-plating alkaline rinse passed the relative humidity test. This demonstrated the effectiveness of the alkaline rinse to improve tarnish resistance of the plated bismuth. Panels plated from compositions of the invention tended to do better in the relative humidity test than those plated from the compositions of the comparative examples. Notably, test panels plated from the compositions of Examples Z1 and Z2 and processed without a post-plating alkaline rinse also did better.

In addition to the aforementioned testing, solderability testing was conducted for the compositions of Examples C1, C2, P1, P2, U1, U2, Z1, Z2 and Comparative Examples M1, M2. The test procedure involved the following steps:

1. Immerse about half the test panel into Alpha Metals PC 7456 flux (a polyalkylene glycol-based flux) for 30 seconds.
2. Remove panel from flux and allow excess flux to drain off.
3. Immerse fluxed panel into molten solder (63 Sn/37 Pb) @ 450° F.±25° for 10 seconds.
4. Remove panel from solder and place in warm water (120° F.) basin for 30 seconds.
5. Remove panel from basin, thoroughly rinse in free flowing tap water for 1 minute, and dry.

The following tables summarize the solderability test results. Coatings of test panels processed with a post-plating alkaline rinse (PC 7019) were generally superior to those of corresponding panels processed without the rinse.

| SOLDERABILITY TEST RESULTS | |
| --- | --- |
| EXAMPLES* | RESULT |
| C1, C2 | good, even coating |
| P1, P2 | very good, even coating |
| U1, U2 | good, very minor dewetting |
| Z1, Z2 | excellent, smooth and very bright coating |
| M1, M2 | fair, some dewetting |

*Processed without post-plating alkaline rinse.

| SOLDERABILITY TEST RESULTS | |
| --- | --- |
| EXAMPLES* | RESULT |
| C1, C2 | very good coating |
| P1, P2 | very good coating |
| U1, U2 | good coating |
| Z1, Z2 | excellent coating |
| M1, M2 | good coating |

*processed with post-plating alkaline rinse (PC 7019)

The following table illustrates the effect of contact duration (immersion time) on bismuth coating thickness. In addition to test panels processed as previously described, a second set of test panels was prepared using the same procedure, except that the immersion time in step 5 was 3 minutes instead of 2 minutes. Coating thicknesses were measured by titrimetry. The results appearing in the table also demonstrate the superior plating thickness achieved by the compositions of the present invention relative to compositions using iodide as the bismuth adhesion promoting agent.

| COATING THICKNESS MEASUREMENTS ($\mu$ in.) | | |
| --- | --- | --- |
| EXAMPLE* | Immersion 2 min. | Immersion 3 min. |
| C1 | 5.0 | 6.0 |
| C2 | 6.0 | 6.5 |
| P1 | 4.0 | 5.5 |
| P2 | 4.0 | 6.0 |
| U1 | 5.0 | 6.2 |
| U2 | 4.8 | 6.0 |
| W2 | 5.5 | 6.5 |
| Z1 | 3.2 | 5.8 |
| Z2 | 3.5 | 6.0 |
| M1 | 2.5 | 3.5 |
| M2 | 2.5 | 4.5 |

*All test panels processed with post-plating alkaline rinse (PC 7019).

Further in relation to coating thickness, it has been discovered that use of a nitric acid based pre-cleaner during preparation of the surface to be plated can significantly increase the bismuth coating thickness achieved. Test panels plated in accordance with the procedures described above, but using a nitric acid based pre-cleaner in place of PC 7051 pre-cleaner, exhibited a substantial increase in thickness relative to panels pre-cleaned with PC 7051. Results are shown in the following table. Note that plating thicknesses of the comparative examples were also increased.

| THICKNESS MEASUREMENTS ($\mu$ in.) FOR PANELS PROCESSED WITH NITRIC ACID BASED PRE-CLEANER | | |
| --- | --- | --- |
| EXAMPLE* | Immersion 2 min. | Immersion 3 min. |
| C1 | 9.0 | 11.0 |
| C2 | 10.0 | 12.0 |
| P1 | 9.0 | 10.5 |
| P2 | 9.5 | 11.0 |
| U1 | 10.0 | 11.5 |
| U2 | 10.5 | 12.0 |
| W2 | 9.5 | 11.0 |
| Z1 | 9.0 | 12.0 |
| Z2 | 10.0 | 12.5 |
| M1 | 5.0 | 7.0 |
| M2 | 5.0 | 7.5 |

*All test panels processed with post-plating alkaline rinse (PC 7019).

Examples 4/30-2, 4/30-3, 4/30-4 and Comparative Example 4/30-1:

Compositions shown in the following four tables (concentrations in grams per liter) were prepared from concentrate in the same manner as previously described. Test panels of the type and dimensions previously described were processed in accordance with the same procedure as the earlier discussed examples (no post-plating alkaline rinse), except that the tap water rinses were 30 seconds and the final deionized water rinse was omitted. Panels for each example were immersion bismuth plated with the plating compositions at operating temperatures of 135°, 140°, and 150° F. Some panels were also plated at 150° F. and processed with a post-plating alkaline rinse.

| COMPARATIVE EXAMPLE M1 | Concentrate | | Immersion |
|---|---|---|---|
| 4/30-1 | A | B | Bismuth |
| DI Water | 13.33 | 707.17 | 744.1 |
| Bismuth Trioxide | 24.24 | — | 4.85 |
| Hydrochloric Acid, 37% | 569.64 | — | 113.93 |
| Glycolic Acid, 70% | 603.45 | — | 120.72 |
| Potassium Iodide | .73 | — | .15 |
| Carbowax 1450 NF | .61 | — | .12 |
| Sodium Hydroxide, 50% | — | 435.93 | 87.19 |
| Versene 100 | — | 67.81 | 13.56 |

| | Concentrate | | Immersion |
|---|---|---|---|
| EXAMPLE 4/30-2 | A | B | Bismuth |
| DI Water | 13.33 | 707.17 | 744.1 |
| Bismuth Trioxide | 24.24 | — | 4.86 |
| Hydrochloric Acid, 37% | 569.64 | — | 113.93 |
| Glycolic Acid, 70% | 603.45 | — | 120.72 |
| Curimid-PTI* | .73 | — | .15 |
| Carbowax 1450 NF | .61 | — | .12 |
| Sodium Hydroxide, 50% | — | 435.93 | 87.19 |
| Versene 100 | — | 67.81 | 13.56 |

*1-methyl-3-propylimidazole-2-thione, Poly Organix Inc.

| | Concentrate | | Immersion |
|---|---|---|---|
| EXAMPLE 4/30-3 | A | B | Bismuth |
| DI Water | 6.96 | 707.17 | 742.82 |
| Bismuth Trioxide | 13.5 | — | 2.7 |
| Hydrochloric Acid, 37% | 692.87 | — | 138.57 |
| Glycolic Acid, 70% | 502.23 | — | 100.45 |
| Dimethylamine HCl | 5.8 | — | 1.16 |
| Tartaric Acid | 1.26 | — | .25 |
| SXS 40 | .31 | — | .06 |
| Allyl Thiourea | 3.74 | — | .75 |
| Carbowax 1450 NF | 2.0 | — | .4 |
| Chemeen C-2 | 1.13 | — | .23 |
| Nitric Acid | 1.13 | — | .23 |
| Sodium Hydroxide, 50% | — | 435.93 | 87.19 |
| Versene 100 | — | 67.81 | 13.56 |

| | Concentrate | | Immersion |
|---|---|---|---|
| EXAMPLE 4/30-4 | A | B | Bismuth |
| DI Water | 6.96 | 707.17 | 742.82 |
| Bismuth Trioxide | 13.5 | — | 2.7 |
| Hydrochloric Acid, 37% | 692.87 | — | 138.57 |
| Glycolic Acid, 70% | 502.23 | — | 100.45 |
| Dimethylamine HCl | 5.8 | — | 1.16 |
| Tartaric Acid | 1.26 | — | .25 |
| SXS 40 | .31 | — | .06 |
| Curimid-PTI | 3.74 | — | .75 |
| Carbowax 1450 NF | 2.0 | — | .4 |
| Chemeen C-2 | 1.13 | — | .23 |
| Nitric Acid | 1.13 | — | .23 |
| Sodium Hydroxide, 50% | — | 435.93 | 87.19 |
| Versene 100 | — | 67.81 | 13.56 |

The composition of Example 4/30-3, which used allyl thiourea as the bismuth adhesion-promoting agent, provided excellent light gray bismuth metal coatings at all operating temperatures and showed the best tarnish (oxidation) resistance. The coatings passed the adhesion test and exhibited good solderability for all operating temperatures.

The compositions of Examples 4/30-2 and 4/30-4, which used a thione compound to promote bismuth adhesion, provided comparatively good plating uniformity and better plating appearance at 150° F. relative to the lower operating temperatures. The bismuth metal coatings were dark gray. Tarnish resistance was much better than with Comparative Example 4/30-1. The coatings passed the adhesion test and exhibited satisfactory solderability for all operating temperatures, but solderability was better at the higher operating temperatures.

Comparative Example 4/30-1 produced coatings that appeared coppery at the lower operating temperatures. At 150° F., the coatings were significantly better in uniformity and appearance of the bismuth metal. The coatings passed the adhesion test and exhibited satisfactory solderability for all operating temperatures, with solderability being better at the higher operating temperatures. However, adhesion and solderability test results were not as good as those for the coatings of Examples 4/30-2 and 4/30-4 and were substantially inferior to those for the coatings of Example 4/30-3.

Examples 5/6-a through 5/6-f:

Concentrate A of Example 4/30-3 was used alone, at different levels of dilution with deionized water, to immersion bismuth plate 2 in.×3 in. test panels of the type previously described. Dilution levels of 0%, 20%, 40%, 50%, 60%, and 80% by volume were used to produce the immersion bismuth compositions (at 0% dilution, the immersion bismuth composition was, of course, the same as the concentrate). The test panels were processed in accordance with the same procedure used for Examples C1, C2 . . . Z1, Z2 (with post-plating alkaline rinse). The pH of each immersion bismuth plating composition was less than 1.

Of the foregoing examples, the compositions having dilution levels up to 50% were found to produce uniform, bright gray bismuth metal coatings that passed the earlier described adhesion and relative humidity tests and that exhibited good to excellent solderability. Plating appearance (color/uniformity) tended to be better than formulations based on a combination of concentrates A and B. A 20% dilution produced the best plating appearance. Dilution levels above 50% resulted in darker gray coatings of substantially less uniformity and of lower quality with respect to adhesion, relative humidity resistance, and solderability.

Examples 5/2-1 through 5/2-6, and 5/2-13:

Immersion bismuth plating compositions were prepared from concentrate in accordance with the formulations in the following tables (concentrations in grams per liter) and in the same manner as described in connection with Examples C1, C2 ... Z1, Z2. The compositions formulated with thione (Curimid-PTI) notably evidenced a relatively low solubility of that ingredient, tending to form either suspensions or to undergo a degree of precipitation. The compositions formed with a thiourea derivative (allyl thiourea) and containing no thione were clear, light amber liquids, which is more preferred in practice. All of the compositions had a pH less than 1.

| EXAMPLE 5/2–1 | Concentrate A | B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 564.19 | — | 112.84 |
| Glycolic Acid, 70% | 599.58 | — | 119.92 |
| Dimethylamine HCl | .61 | — | .12 |
| Tartaric Acid | .61 | — | .12 |
| SXS 40 | .12 | — | .02 |
| Allyl Thiourea | 6.06 | — | 1.21 |
| Nitric Acid | .61 | — | .12 |
| Carbowax 1450 NF | .61 | — | .12 |
| Chemeen C-2 | .12 | — | .02 |
| Sodium Hydroxide, 50% | — | 435.93 | 87.19 |
| Versene 100 | — | 67.81 | 13.56 |

| EXAMPLE 5/2–2 | Concentrate A | B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 564.19 | — | 112.84 |
| Glycolic Acid, 70% | 599.58 | — | 119.92 |
| Dimethylamine HCl | .61 | — | .12 |
| Tartaric Acid | .61 | — | .12 |
| SXS 40 | .12 | — | .02 |
| Curimid-PTI | 6.06 | — | 1.21 |
| Nitric Acid | .61 | — | .12 |
| Carbowax 1450 NF | .61 | — | .12 |
| Chemeen C-2 | .12 | — | .02 |
| Sodium Hydroxide, 50% | — | 435.93 | 87.19 |
| Versene 100 | — | 67.81 | 13.56 |

| EXAMPLE 5/2–3 | Concentrate A | B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 570.25 | — | 114.05 |
| Glycolic Acid, 70% | 589.4 | — | 117.88 |
| Dimethylamine HCl | .61 | — | .12 |
| Tartaric Acid | .61 | — | .12 |
| SXS 40 | .12 | — | .02 |
| Allyl Thiourea | 12.12 | — | 2.42 |
| Nitric Acid | .61 | — | .12 |
| Carbowax 1450 NF | .61 | — | .12 |
| Chemeen C-2 | .12 | — | .02 |
| Sodium Hydroxide, 50% | — | 435.93 | 87.19 |
| Versene 100 | — | 67.81 | 13.56 |

| EXAMPLE 5/2–4 | Concentrate A | B | Immersion Bismuth |
|---|---|---|---|
| DI Water | 13.33 | 707.17 | 744.1 |
| Bismuth Trioxide | 24.24 | — | 4.85 |
| Hydrochloric Acid, 37% | 570.25 | — | 114.05 |
| Glycolic Acid 70% | 589.4 | — | 117.88 |
| Dimethylamine HCl | .61 | — | .12 |
| Tartaric Acid | .61 | — | .12 |
| SXS 40 | .12 | — | .02 |
| Curimid-PTI | 12.12 | — | 2.42 |
| Nitric Acid | .61 | — | .12 |
| Carbowax 1450 NF | .61 | — | .12 |
| Chemeen C-2 | .12 | — | .02 |
| Sodium Hydroxide, 50% | — | 435.93 | 87.19 |
| Versene 100 | — | 67.81 | 13.56 |

| EXAMPLE 5/2–3a | Concentrate A | B | Immersion Bismuth |
|---|---|---|---|
| DI Water | 13.21 | 707.17 | 744.1 |
| Bismuth Trioxide | 24.02 | — | 4.8 |
| Hydrochloric Acid, 37% | 565.05 | — | 113.01 |
| Glycolic Acid, 70% | 578.02 | — | 115.04 |
| Dimethylamine HCl | .6 | — | .12 |
| Tartaric Acid | .6 | — | .12 |
| SXS 40 | .12 | — | .02 |
| Allyl Thiourea | 18.01 | — | 3.6 |
| Nitric Acid | .6 | — | .12 |
| Carbowax 1450 NF | .6 | — | .12 |
| Chemeen C-2 | .12 | — | .02 |
| Sodium Hydroxide, 50% | — | 435.93 | 87.19 |
| Versene 100 | — | 67.81 | 13.56 |

| EXAMPLE 5/2–2a | Concentrate A | B | Immersion Bismuth |
|---|---|---|---|
| DI Water | 13.21 | 707.17 | 744.1 |
| Bismuth Trioxide | 24.02 | — | 4.8 |
| Hydrochloric Acid, 37% | 565.05 | — | 113.01 |
| Glycolic Acid, 70% | 578.02 | — | 115.04 |
| Dimethylamine HCl | .6 | — | .12 |
| Tartaric Acid | .6 | — | .12 |
| SXS 40 | .12 | — | .02 |
| Curimid-PTI | 18.01 | — | 3.6 |
| Nitric Acid | .6 | — | .12 |
| Carbowax 1450 NF | .6 | — | .12 |
| Chemeen C-2 | .12 | — | .02 |
| Sodium Hydroxide, 50% | — | 435.93 | 87.19 |
| Versene 100 | — | 67.81 | 13.56 |

|  | Concentrate | | Immersion |
|---|---|---|---|
| EXAMPLE 5/2–5 | A | B | Bismuth |
| DI Water | 13.21 | 707.17 | 744.1 |
| Bismuth Trioxide | 24.02 | — | 4.8 |
| Hydrochloric Acid, 37% | 565.05 | — | 113.01 |
| Glycolic Acid, 70% | 572.02 | — | 114.4 |
| Dimethylamine HCl | .60 | — | .12 |
| Tartaric Acid | .60 | — | .12 |
| SXS 40 | .12 | — | .02 |
| Allyl Thiourea | 24.02 | — | 4.8 |
| Nitric Acid | .6 | — | .12 |
| Carbowax 1450 NF | .6 | — | .12 |
| Chemeen C-2 | .12 | — | .02 |
| Sodium Hydroxide, 50% | — | 435.93 | 87.19 |
| Versene 100 | — | 67.81 | 13.56 |

|  | Concentrate | | Immersion |
|---|---|---|---|
| EXAMPLE 5/2–6 | A | B | Bismuth |
| DI Water | 13.21 | 707.17 | 744.1 |
| Bismuth Trioxide | 24.02 | — | 4.8 |
| Hydrochloric Acid, 37% | 565.05 | — | 113.01 |
| Glycolic Acid, 70% | 572.02 | — | 114.4 |
| Dimethylamine HCl | .60 | — | .12 |
| Tartaric Acid | .60 | — | .12 |
| SXS 40 | .12 | — | .02 |
| Curimid-PTI | 24.02 | — | 4.8 |
| Nitric Acid | .6 | — | .12 |
| Carbowax 1450 NF | .6 | — | .12 |
| Chemeen C-2 | .12 | — | .02 |
| Sodium Hydroxide, 50% | — | 435.93 | 87.19 |
| Versene 100 | — | 67.81 | 13.56 |

|  | Concentrate | | Immersion |
|---|---|---|---|
| EXAMPLE 5/2–13 | A | B | Bismuth |
| DI Water | 13.21 | 707.17 | 744.1 |
| Bismuth Trioxide | 24.02 | — | 4.8 |
| Hydrochloric Acid, 37% | 565.05 | — | 113.01 |
| Glycolic Acid, 70% | 572.02 | — | 114.4 |
| Dimethylamine HCl | .60 | — | .12 |
| Tartaric Acid | .60 | — | .12 |
| SXS 40 | .12 | — | .02 |
| Allyl Thiourea | 12.01 | — | 4.4 |
| Curimid-PTI | 12.01 | — | 4.4 |
| Nitric Acid | .6 | — | .12 |
| Carbowax 1450 NF | .6 | — | .12 |
| Chemeen C-2 | .12 | — | .02 |
| Sodium Hydroxide, 50% | — | 435.93 | 87.19 |
| Versene 100 | — | 67.81 | 13.56 |

2 in.×2 in. test panels of the type previously described were immersion bismuth plated using the compositions of the foregoing examples. The panels were processed using the same procedure as was described in connection with Examples C1, C2 . . . Z1, Z2 (including post-plating alkaline rinse).

Upon visual inspection of the bismuth plated panels, it was found that of the compositions containing allyl thiourea and no thione, Example 5/2-1 produced an excellent, highly adherent bismuth metal coating that was very uniform and bright gray.

Examples 5/2-3, 5/2-3a, and 5/2-5, which had higher concentrations of allyl thiourea, tended to produce darker, less adherent coatings. Examples 5/2-1 and 5/2-3 clearly passed the earlier described bismuth adhesion test, while Examples 5/2-3a and 5/2-6 (higher concentrations of allyl thiourea) gave borderline results.

The compositions containing the thione and no allyl thiourea tended to produce dark gray coatings having some degree of patchiness. Examples 5/2-2, 5/2-2a, and 5/2-4 all passed the bismuth adhesion test, although Example 5/2-2 (lower thione concentration) provided clearly better bismuth adhesion. Example 5/2-6 (highest thione concentration) gave borderline results.

Example 5/2-13, which contained both allyl thiourea and thione, produced a very dark gray coating which passed the bismuth adhesion test.

All of Examples 5/2-1 through 5/2-6, and 5/2-13 provided satisfactory results in relative humidity and solderability testing.

As will be apparent to those skilled in the art, the present invention is not listed to the illustrative embodiments presented herein. Many variations are possible without departing from the principles and spirit of the invention, the scope of which is defined in the appended claims.

What is claimed is:

1. A coating composition that is effective for immersion plating a coating of bismuth metal onto a copper-containing surface, and that comprises a moderately to strongly acidic mixture containing dissolved bismuth, halide ion, and a sulfur-containing ligand as a complexing agent.

2. A method of protecting a copper-containing surface, comprising:
   providing a coating composition that is constituted by a moderately to strongly acidic mixture containing dissolved bismuth, halide ion, and a sulfur-containing ligand as a complexing agent, and that is effective for immersion plating bismuth metal onto said surface; and
   contacting said surface with said composition, to form a bismuth metal coating on said surface.

3. A moderately to strongly acidic coating composition that is effective for immersion plating a coating of bismuth metal onto a copper-containing surface, and that comprises a salt of bismuth solubilized in a halogen acid, and a sulfur-containing ligand as a complexing agent.

4. A method of protecting a copper-containing surface, comprising:
   providing a moderately to strongly acidic coating composition that contains a salt of bismuth solubilized in a halogen acid, and a sulfur-containing ligand as a complexing agent, and that is effective for immersion plating bismuth metal onto said surface; and
   contacting said surface with said composition, to form a bismuth metal coating on said surface.

5. The invention of any of claims 1–4, wherein the sulfur-containing ligand is selected from the group consisting of thiourea derivatives and thione compounds.

6. The invention of claim 5, wherein the sulfur-containing ligand is allyl thiourea.

7. The invention of claim 1 or 2, wherein said halide ion includes chloride ion.

8. The invention of claim 7, wherein the halide ion is present in an amount substantially in excess of the stoichiometric amount of bismuth.

9. The invention of claim 8, wherein the bismuth is provided as a component of a bismuth salt.

10. The invention of claim 3 or 4, wherein the coating composition contains chloride ion substantially in excess of the stoichiometric amount of bismuth.

11. The invention of any of claims 1–4, wherein the composition has a pH not exceeding 4.

12. The invention of claim 11, wherein the pH does not exceed 1.

13. The invention of any of claims 1–4, wherein the composition contains a film-forming agent.

14. The invention of claim 13, wherein the film forming agent is selected from the group consisting of polyoxyethylated fatty amines.

15. The invention of any of claims 1–4, wherein the composition includes a pre-addition of copper.

16. The invention of any of claims 1–4, wherein the composition contains a source of nitrate ion.

17. The invention of claim 16, wherein the source of nitrate ion is nitric acid.

18. The invention of any of claims 1–4, wherein the composition is an aqueous mixture consisting essentially of bismuth salt, halogen acid, sulfur-containing ligand as a complexing agent, water, and, optionally, one or more of an additional complexing agent, a film-forming agent, a source of nitrate ion, and a pre-addition of copper.

19. The invention of claim 18, wherein the composition has a pH not exceeding 1 and satisfies the following composition ranges, in grams per liter:

| | |
|---|---|
| bismuth salt | 0.5–20 |
| halogen acid (concentrated) | 50–800 |
| sulfur-containing ligand | 0.001–5 |
| additional complexing agent(s) | 0–300 |
| film-forming agent | 0–2 |
| nitrate ion source | 0–5 |
| copper pre-addition | 0–1. |

20. The invention of claim 18, wherein the halogen acid is hydrochloric acid.

21. The invention of claim 18, wherein the sulfur-containing ligand is selected from the group consisting of thiourea derivatives and thione compounds.

22. The invention of claim 21, wherein the sulfur-containing ligand is allyl thiourea.

23. The invention of claim 2 or 4, further comprising contacting the plated bismuth coating with an alkaline composition to neutralize acid residues on the coating.

24. The invention of claim 2 or 4, wherein the surface is a copper surface of a printed circuit substrate.

25. A coating for protecting a copper-containing surface, comprising a bismuth metal deposition from an immersion plating composition in accordance with claim 1 or 3.

26. The invention of claim 25, wherein said surface is a copper surface for use in an electrical circuit.

27. A method of improving tarnish resistance of a bismuth metal coating plated from an acidic bath onto a copper-containing surface, comprising:

contacting the coating with an alkaline composition that neutralizes acid residues on the coating.

28. The invention of claim 27, wherein said acid neutralizer is a phosphate-containing alkaline composition.

29. An acidic aqueous concentrate composition that can be combined with water to form a composition that is effective for immersion plating a coating of bismuth metal onto a copper-containing surface, said concentrate composition containing, in grams per liter:

| | |
|---|---|
| bismuth salt | 2.5–100 |
| halogen acid (concentrated) | 250–4,000 |
| sulfur-containing ligand | .005–25 |
| additional complexing agent(s) | 0–1,500 |
| film-forming agent | 0–10 |
| nitrate ion source | 0–25 |
| copper pre-addition | 0–5. |

30. A concentrate system including a first concentrate composition according to claim 29, and an alkaline second aqueous concentrate composition to be used in combination with said first concentrate composition and containing, in grams per liter:

| | |
|---|---|
| EDTA salt | 2.5–100 |
| pH buffer | 12.5–500. |

31. A concentrate system according to claim 30, combined with water to yield an immersion bismuth plating composition having a pH less than 1.

32. A method according to claim 27, wherein the bismuth metal coating is an immersion plated coating on a copper-containing surface.

33. An improved immersion bismuth plating process, wherein a surface to be plated is pre-cleaned with a pre-cleaner containing nitric acid.

34. A process according to claim 33, wherein the surface is a copper-containing surface.

* * * * *